United States Patent
Kothandapani

(10) Patent No.: US 10,211,115 B2
(45) Date of Patent: Feb. 19, 2019

(54) METHOD OF MAKING A CERAMIC COMBO LID WITH SELECTIVE AND EDGE METALLIZATIONS

(71) Applicant: Materion Corporation, Mayfield Heights, OH (US)

(72) Inventor: Ramesh Kothandapani, Singapore (SG)

(73) Assignee: MATERION CORPORATION, Mayfield Heights, OH (US)

( * ) Notice: Subject to any disclaimer, the term of this patent is extended or adjusted under 35 U.S.C. 154(b) by 329 days.

(21) Appl. No.: 14/718,154

(22) Filed: May 21, 2015

(65) Prior Publication Data

US 2015/0340298 A1 Nov. 26, 2015

Related U.S. Application Data

(60) Provisional application No. 62/001,166, filed on May 21, 2014.

(51) Int. Cl.

| | |
|---|---|
| *B23K 1/20* | (2006.01) |
| *H01L 23/06* | (2006.01) |
| *B23K 1/00* | (2006.01) |
| *B23K 31/02* | (2006.01) |
| *H01L 23/04* | (2006.01) |
| *H01L 21/48* | (2006.01) |
| *H01L 23/08* | (2006.01) |
| *H01L 23/10* | (2006.01) |
| *H01L 21/50* | (2006.01) |

(52) U.S. Cl.
CPC ............ *H01L 23/06* (2013.01); *B23K 1/0016* (2013.01); *B23K 1/20* (2013.01); *B23K 31/02* (2013.01); *H01L 21/4803* (2013.01); *H01L 21/4817* (2013.01); *H01L 21/50* (2013.01); *H01L 23/04* (2013.01); *H01L 23/08* (2013.01); *H01L 23/10* (2013.01); *H01L 2924/16195* (2013.01)

(58) Field of Classification Search
USPC ........................................................ 427/282
See application file for complete search history.

(56) References Cited

U.S. PATENT DOCUMENTS

| | | | | |
|---|---|---|---|---|
| 4,038,157 | A * | 7/1977 | Kim ......................... | C25D 7/12 205/123 |
| 4,331,258 | A * | 5/1982 | Geschwind ........... | H01L 23/057 174/564 |
| 4,833,102 | A * | 5/1989 | Byrne ..................... | B23K 1/14 174/50.51 |
| 5,742,007 | A * | 4/1998 | Kornowski ......... | H01L 21/6835 174/535 |
| 5,783,464 | A * | 7/1998 | Burns ..................... | H01L 21/50 438/112 |
| 2004/0183172 | A1* | 9/2004 | Saito ..................... | H01L 23/057 257/678 |

(Continued)

Primary Examiner — Brian K Talbot
(74) Attorney, Agent, or Firm — Fay Sharpe LLP

(57) ABSTRACT

A frame lid for use with a semiconductor package is disclosed. First, a mask is applied to a top surface of the lid and over a central area of the top surface to define a peripheral area. Next, a seal ring is formed by metallizing the peripheral area and the sidewall of the plate. The mask can then be removed obtain the frame lid. Next, a solder preform can be attached to the seal ring. This reduces pullback and shrinkage of the metallized layer, while lowering the manufacturing cost and process times.

16 Claims, 6 Drawing Sheets

(56) References Cited

U.S. PATENT DOCUMENTS

| | | | |
|---|---|---|---|
| 2013/0049555 A1* | 2/2013 | Ramesh | H01L 23/053 312/223.1 |
| 2014/0264949 A1 | 9/2014 | Kothandapani | |

* cited by examiner

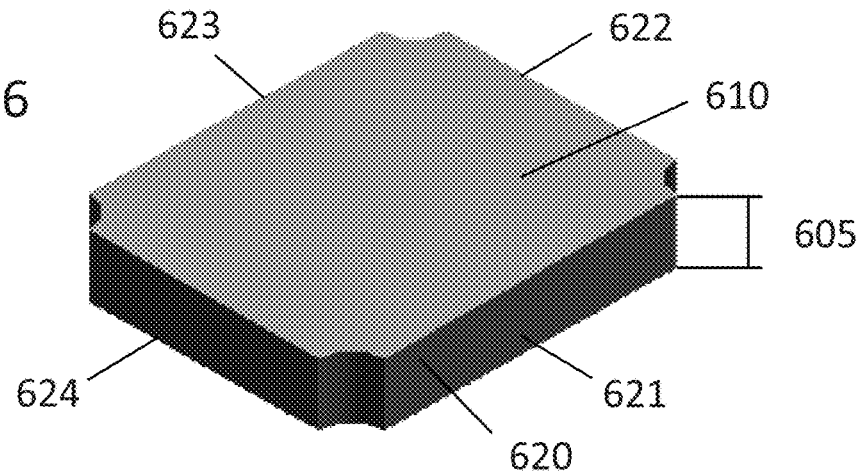
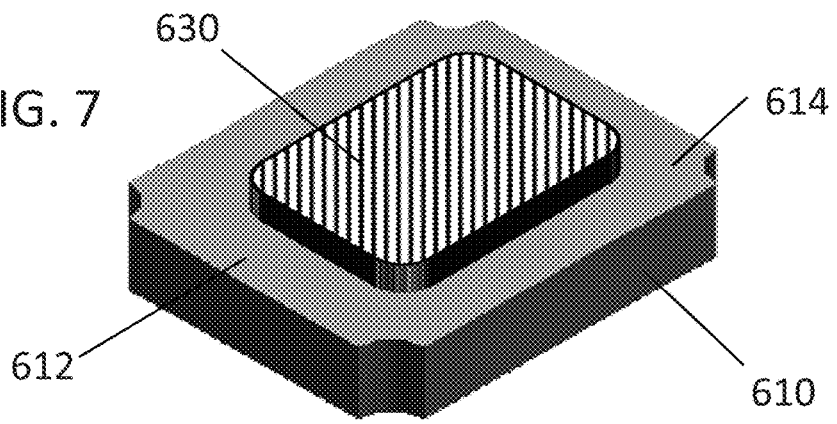

METHOD OF MAKING A CERAMIC COMBO LID WITH SELECTIVE AND EDGE METALLIZATIONS

CROSS-REFERENCE TO RELATED APPLICATIONS

This application claims priority to U.S. Provisional Patent Application Ser. No. 62/001,166, filed on May 21, 2014, the entirety of which is fully incorporated by reference herein.

BACKGROUND

The present disclosure relates to semiconductor packages. It finds particular application in conjunction with frame lids for enclosing electronic components in a semiconductor package, and will be described with particular reference thereto. More specifically, methods for making such frame lids with reduced defects are described herein, as are the frame lids formed thereby and electronic packages including such frame lids. However, it is to be appreciated that the present disclosure is also amenable to other like applications.

Frame lids are used for hermetically sealing certain electronic components in semiconductor packages. Hermetically sealed electronic packages can be made by placing a frame lid over an electronic component mounted within a cavity of an insulating package base. Traditionally, a metal substrate is stamped to provide a surface on the formed lid for soldering the lid to a package base which has been mounted to the electronic components. After stamping, the surface is nickel plated, followed by plating of the surface with a thin layer of gold. A solder (e.g. a lead-free or lead-based alloy) preform whose shape corresponds to the area to be soldered is placed on the gold layer. To hermetically seal the package, the solder is heated to cause it to flow. Soft solder has a relatively low melting temperature, so sealing can be performed at a low temperature.

When the frame lid is made of a non-metallic material, the frame lid must be metallized to form a metal layer on the periphery of the surface to enable the frame lid to be bonded by soldering. This adds to the production costs of the frame lid.

Some issues can arise with the metallized layer on the frame lid. First, the mask used to metallize the peripheral area can be offset (i.e. incorrectly registered), resulting in different widths of the metallized portion around the periphery of the frame lid and potentially weakening the hermetic seal on the portion that is now thinner than intended. Second, the metallized layer can pull back from the edges of the lid, creating gaps and again potentially weakening the hermetic seal. Outgassing can also occur due to organic content in the metallized layer. These can result in leak failures, delamination, poor bonding, etc. In addition, issues can arise with the solder, such as solder voids, dewetting, splatters, and PIND failures (when excess solder forms particles inside the cavity).

It would be desirable to develop an alternate method for producing frame lid assemblies that minimize these defects.

BRIEF DESCRIPTION

Aspects of the present disclosure are directed to frame lids, and methods of making the same, having one or more materials applied thereto via sputter deposition. The frame lid is formed from a plate. A metal mask is applied to a surface of the plate, thus defining a central area covered by the mask and a peripheral area not covered by the mask. The peripheral area and the sidewall of the plate are metallized to form a seal ring, and the mask is removed. As desired, the seal ring can be formed from additional metal sublayers. A solder preform can then be attached to the seal ring, for example by tack welding.

Disclosed herein are various methods of making a frame lid. One embodiment can first include applying a metal mask to a central area of a top surface of a plate and define a peripheral area on the top surface, wherein the plate has a top surface, a bottom surface, and a sidewall joining the top surface and bottom surface together. The method can next include forming a seal ring by metallizing the peripheral area and the sidewall of the plate. Finally, the method can include removing the metal mask to obtain the frame lid.

Also disclosed herein are frame lids. The frame lids can include a plate comprising a top surface, a bottom surface, and a sidewall joining the top surface and bottom surface together. A seal ring can be defined on a peripheral area of the top surface and the sidewall of the plate. A solder preform can be connected to the seal ring on the peripheral area.

The plate can be made from beryllium-copper, molybdenum, bronze, glass, an iron-nickel-cobalt alloy, or a ceramic selected from the group consisting of alumina (Al2O3), beryllia (BeO), aluminum nitride (AlN), zirconia toughened alumina (ZTA), SiC, and Si3N4. The plate may have a thickness of about 0.5 millimeter to about 1 millimeter. In some particular embodiments, the plate is formed from a non-magnetic material. In some particular embodiments, the plate can be in the shape of a disk or a rectangular prism.

The metallizing can be achieved by sputtering specific surfaces of the frame lid including the sidewall thereof, which can have a plurality of faces. The sputtered material can be applied without organic materials, such as organic fluxes used in prior art plating techniques. The materials can include a wide range of metals and/or metal alloys. The lid substrate can be ceramic, and the sputtered material can exclude ferrous elements or alloys, resulting in a completely non-magnetic frame lid assembly.

The peripheral area which is metallized may be from about 20% to about 35% of the surface area of the top surface of the plate. In some embodiments, the seal ring is formed from a metal selected from the group consisting of silver, palladium, platinum, nickel, gold, titanium, tungsten-copper-nickel, palladium-gold-tin, and alloys thereof. Sometimes, the seal ring can be formed from a set of sublayers. In other embodiments, the seal ring can be formed from a non-magnetic metal. The seal ring on the peripheral area may have a width of about 0.5 mm to about 1 mm. The seal ring on the peripheral area can have a thickness of about 1 micrometer (μm) to about 40 μm.

Solder preforms can be positioned on the selectively metallized lid, and tack/spot welded in one or more locations to secure the preform in place during shipping and/or assembly of the package. In some particular embodiments, the solder preform can have a melting temperature of from about 200° C. to about 350° C. In other embodiments, the solder preform may be formed from a gold-tin alloy, a lead-based alloy, or a lead-free alloy.

These and other non-limiting characteristics of the disclosure are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

FIG. 6 is a perspective view of a plate from which a frame lid will be made.

FIG. 7 is a perspective view of a plate with a mask covering a central area of the plate.

DETAILED DESCRIPTION

Figure 1:
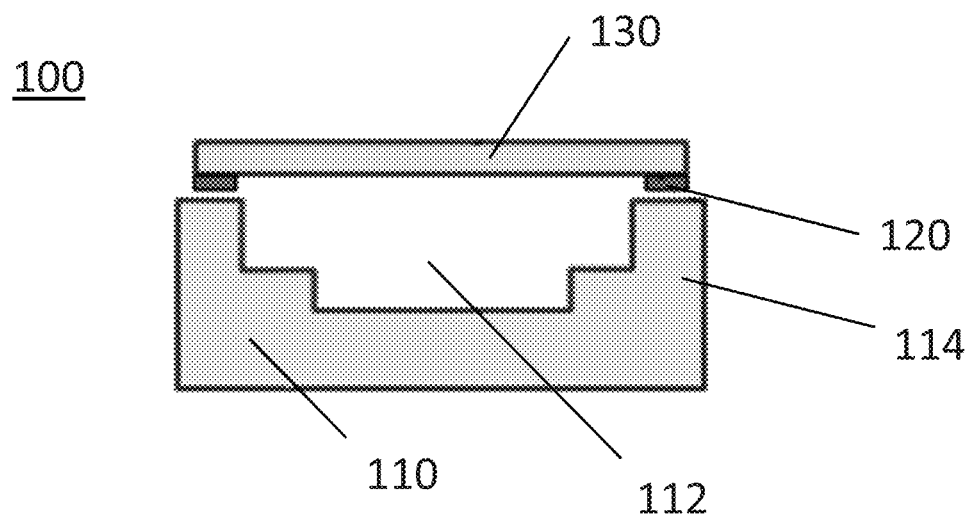
FIG. 1 is a side cross-sectional view of a conventional electronic package.

A more complete understanding of the components, processes, and apparatuses disclosed herein can be obtained by reference to the accompanying drawings. These figures are merely schematic representations based on convenience and the ease of demonstrating the present disclosure, and are, therefore, not intended to indicate relative size and dimensions of the device or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

The singular forms "a," "an," and "the" include plural referents unless the context clearly dictates otherwise.

Numerical values in the specification and claims of this application should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "from 2 grams to 10 grams" is inclusive of the endpoints, 2 grams and 10 grams, and all the intermediate values).

The term "about" can be used to include any numerical value that can carry without changing the basic function of that value. When used with a range, "about" also discloses the range defined by the absolute values of the two endpoints, e.g., "about 2 to about 4" also discloses the range "from 2 to 4." The term "about" may refer to plus or minus 10% of the indicated number.

Figure 2:
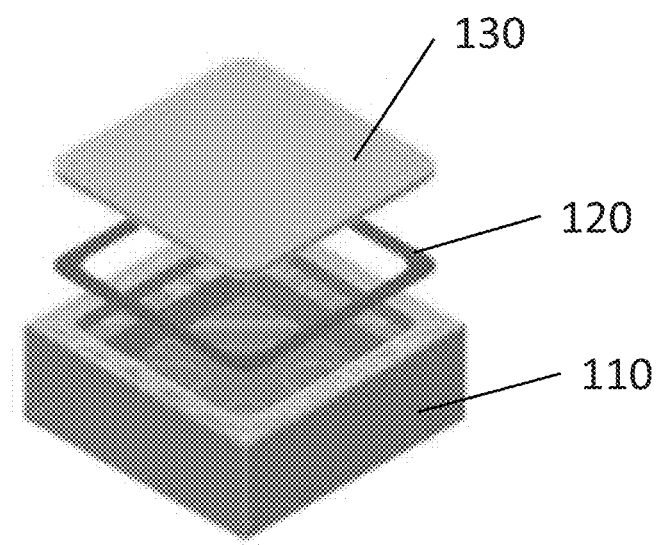
FIG. 2 is an exploded perspective view of a conventional electronic package.

Initially, a hermetically sealable electronic package is illustrated in FIG. 1 and FIG. 2. FIG. 1 is a side cross-sectional view of the package, and FIG. 2 is an exploded perspective view showing various aspects of the package.

The electronic package 100 is formed from an insulating base 110, a solder preform 120, and a lid 130. The base is shaped to include a cavity 112 in which an electronic component (e.g. a semiconductor) is mounted. Not shown here are various leads and vias which may be included with the base. The periphery of the base includes a raised wall 114. When heated, the solder preform melts and fuses the lid to the raised wall of the base.

Figure 3:
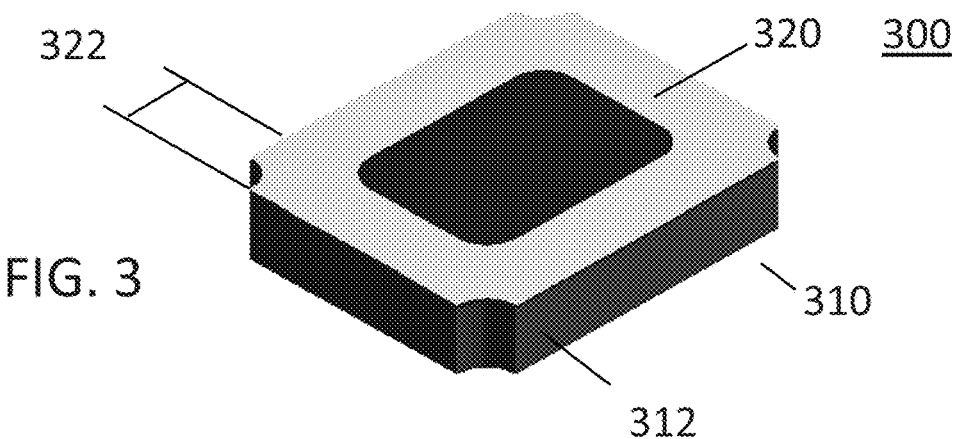
FIG. 3 is a perspective view of an "ideal" frame lid having a plate with a metallized seal ring thereon.

FIG. 3 is a perspective view of a frame lid 300 to be used in hermetically sealing an electronic package. The frame lid includes a plate 310 and a metallized seal ring 320 which is used to permit soldering of the frame lid. FIG. 3 shows an idealized application of the metallized seal ring. Here, the width 322 of the seal ring is constant around the periphery of the plate. It is noted that the seal ring is only present on the top surface of the plate, and does not cover the sidewall 312 of the plate.

Figure 4:
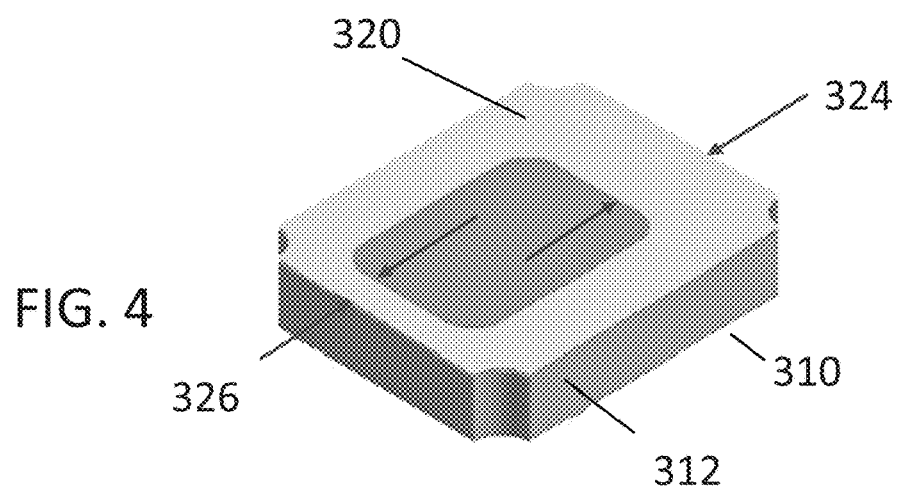
FIG. 4 is a perspective view of a frame lid in which the seal ring is undesirably offset.

In FIG. 4, an undesirable offset seal ring is shown. As seen here, the width 324 of the seal ring on the top right side is larger than desired, and the width 326 of the seal ring on the bottom left side is smaller than desired.

Figure 5:
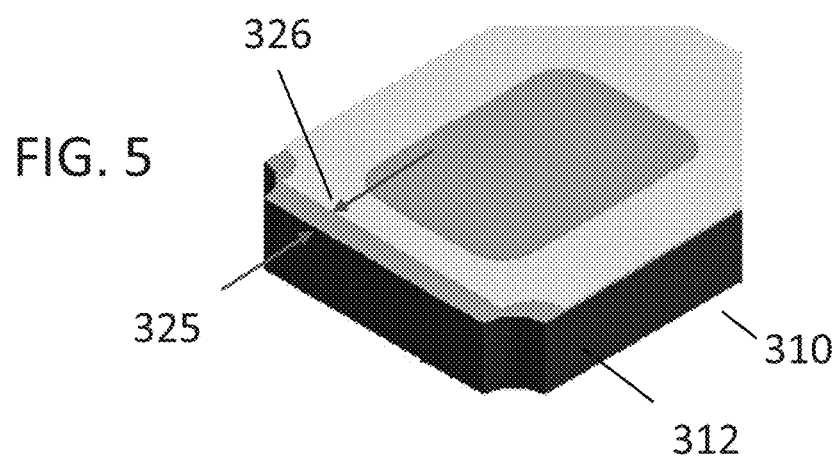
FIG. 5 is a perspective view of a frame lid in which the seal ring has undesirably pulled back from an edge of the plate.

In FIG. 5, pullback of the metallized seal ring is illustrated. Here, a portion 326 of the metallized seal ring is no longer contiguous with the edge 325 of the plate.

The present disclosure provides methods of making a frame lid that reduces these events from occurring. Briefly, a metallic mask is used to cover the central area of the surface of a plate. A seal ring is then formed by metallizing the peripheral area of the surface and the sidewall of the plate as well to form one continuous layer. This improves yield, seal strength, and also provides visual assurance to end users. A solder preform is then tack welded to the seal ring.

Initially, FIG. 6 is a perspective view of the plate from which the frame lid will be formed. The plate 600 can be diced out of a larger substrate to one or more prescribed lid sizes. Dicing can be used to achieve tight tolerances and smaller dimensions compared to pressing, for example. The plate 600 is solid. The exterior of the plate is formed from a top surface 610 and a bottom surface (not visible) opposite the top surface. A sidewall 620 joins the top surface and the bottom surface together. As illustrated here, the plate is a three-dimensional rectangular prism. The top surface and bottom surface are generally parallel to each other, or put another way the plate has a constant thickness 605. The sidewall 620 has four faces 621, 622, 623, 624. However, it is contemplated that the plate could have any shape. For example, the plate could also be a disk, where the top surface and the bottom surface are circular, and the sidewall has only one face.

The plate 600 is made from a non-metallic material. Exemplary non-metallic materials include beryllium-copper, molybdenum, bronze, glass, an iron-nickel-cobalt alloy (e.g. KOVAR™), an iron-nickel binary alloy (e.g. Alloy 42), or a ceramic selected from the group consisting of alumina (Al2O3), beryllia (BeO), aluminum nitride (AlN), zirconia toughened alumina (ZTA), SiC, and Si3N4. The plate has a thickness 605 (measured between the top surface and the bottom surface) of about 0.5 millimeters (mm) to about 1 millimeter. In particular embodiments, the plate is made from a non-magnetic material. This may be useful in certain applications where electrical signals/noise can interfere with the electronic component in the package, e.g. in medical imaging applications.

Next, as illustrated in FIG. 7, a metal mask 630 is applied to a central area 612 of the top surface of the plate. The top surface is thus divided into a central area 612 covered by the mask, and a peripheral area 614 that is not covered by the mask. The mask is generally made beforehand from a desirable metal and with a specified shape and then placed upon the central area of the top surface.

Figure 8A:
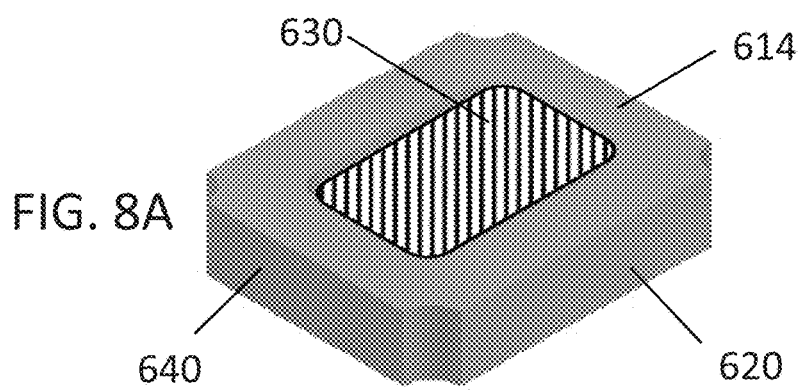
FIG. 8A is a perspective view of a plate after being metallized.

Next, as illustrated in FIG. 8A, the plate is metallized. The metallizing can result in metal being deposited on the mask as well. The metallization creates a layer of metal on the peripheral area 614 of the top surface, and also a layer of metal on the sidewall 620. The combination of these two layers of metal is referred to herein as a seal ring 640. The metal can be silver, palladium, platinum, nickel, gold, titanium, tungsten-copper-nickel, palladium-gold-tin, or alloys thereof. In particular embodiments, the seal ring is formed from a non-magnetic metal. The metallizing can be done by sputter deposition, electroplating, thermal spray, chemical vapor deposition (CVD), or any other suitable means.

Another approach is to use a thin film process to create a "seed" layer, then up-plate the seed layer to a thicker metal layer by an electrolytic or electroless process. The seed layer should not contain any organic contents.

In some desirable embodiments, the seal ring can be formed from a set of sublayers. In such embodiments, there may be two sublayers or three sublayers. For example, the seal ring can be formed by sputtering a first sublayer on the top surface or the sidewall of the plate. Next, a second sublayer can be sputtered to the top surface or sidewall of the plate, the second sublayer applied over the first sublayer. In specific embodiments, a nickel sublayer can be laid down first, then a gold sublayer can be laid down over the nickel sublayer. The nickel sublayer serves as a barrier to corrosion, while the gold sublayer provides a readily solderable surface which ensures a clean particulate-free surface. Each sublayer may have a thickness/depth of 0.001 mm to 0.01 mm (i.e. 1 µm to 10 µm). The seal ring may have a thickness/depth of 0.001 mm to 0.04 mm (i.e. 1 µm to 40 µm).

Figure 8B:
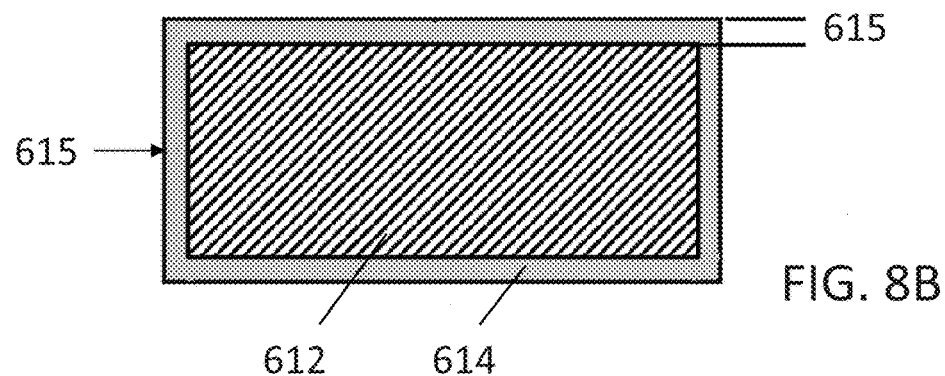
FIG. 8B is a top view of a metallized plate.
Figure 8C:
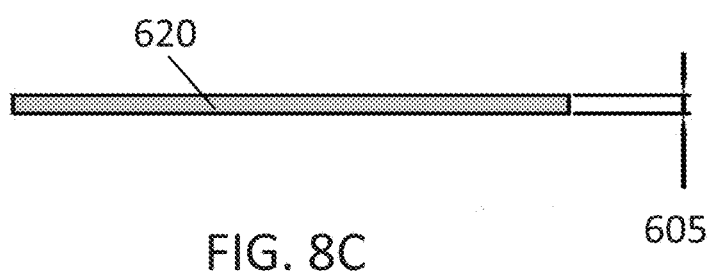
FIG. 8C is a side view of a metallized plate.

FIG. 8B is a plan (top) view of a metallized plate. FIG. 8C is a side view of the metallized plate. Referring to FIG. 8B, the peripheral metallized area is marked with reference numeral 614, and indicated with a clear texture. The central area is marked with reference numeral 612, and indicated with slash lines. The peripheral area is from about 20% to about 35% of the surface area of the top surface of the plate. The central area is from about 65% to about 80% of the surface area of the top surface of the plate. The width of the peripheral area is marked with reference numeral 615, and is from about 0.5 mm to about 1.5 mm. As seen in FIG. 8C, the metal seal ring is also present on the sidewall 620 of the plate. The thickness of the plate is also indicated with reference numeral 605.

Figure 9A:
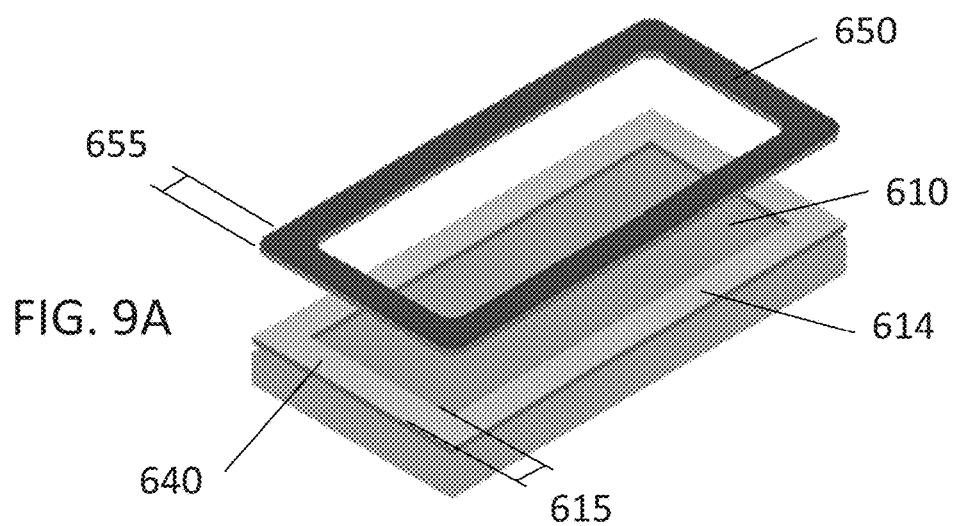
FIG. 9A is an exploded view of a metallized plate with a solder preform.
Figure 9B:
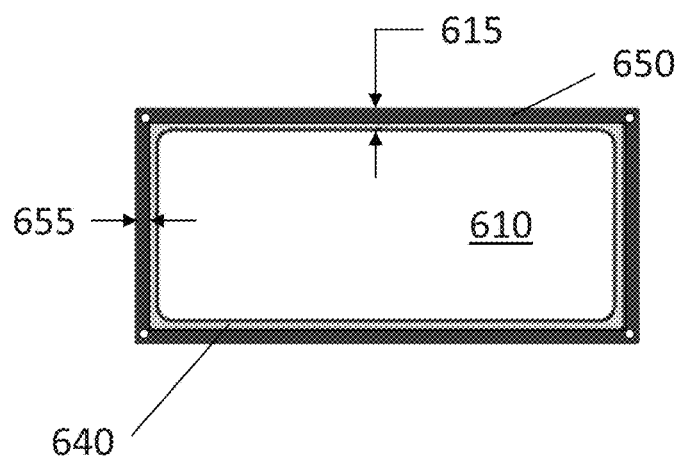
FIG. 9B is a top view of a perspective view of a frame lid in which the seal ring is undesirably offset.

Next, as illustrated in FIG. 9A and FIG. 9B, a solder preform 650 is connected to the seal ring 640. More specifically, the solder preform is laid upon the portion of the seal ring over the peripheral area 614 of the top surface. The solder preform is usually tack welded to the seal ring. Tack welding the solder preform to the frame lid advantageously aligns the solder to the perimeter of the frame lid to simplify handling and reducing part count. FIG. 9A is an exploded view, while FIG. 9B is a plan (top) view of the top surface. In these two figures, the mask is removed, and the top surface 610 is visible. The solder preform is annular. The width 655 of the solder preform can be equal to or less than the width 615 of the peripheral area. The width of the solder preform is from about 0.3 mm to about 0.6 mm. The solder preform desirably has a melting temperature of from about 200° C. to about 350° C. The solder preform can be made from a gold-tin alloy (e.g. 80Au-20Sn), a lead-based alloy, or a lead-free alloy. The solder volume can be adjusted according to application requirements without needing to modify the metallized area. The solder preform should be very uniform to reduce the risk of excess or insufficient solder joints and voids.

Not illustrated is the removal of the metal mask 630 from the central area of the plate. The metal mask is removed from the plate after the metallizing that forms the seal ring. However, the metal mask could be removed either before or after the connecting of the solder preform, as desired. The central area of the top surface of the final frame lid is thus not metallized; rather the top surface is visible in the central area. After removing the metal mask 630 from the plate, the mask can be reused on a different plate, if desired.

Figure 10:
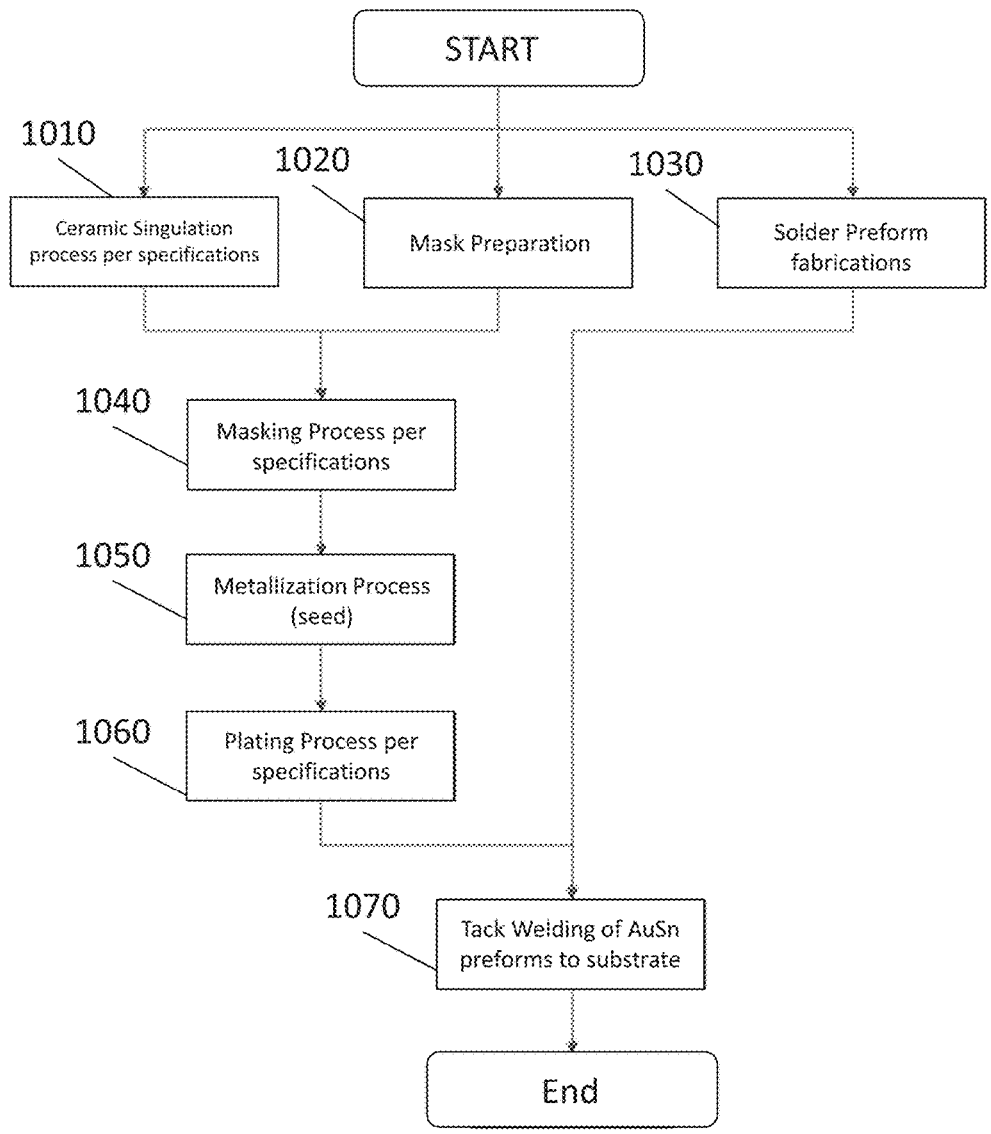
FIG. 10 is a process flowchart of the methods of the present disclosure.

FIG. 10 is a process flowchart that summarizes the steps described above. When the plate of the frame lid is formed from a ceramic, the ceramic plate is singulated from a larger ceramic panel (1010). The mask is prepared (1020). The solder preform is also fabricated (1030). The ceramic plate is then masked (1040) using a metal mask, and metallized (1050). The optional addition of sublayers upon the first metallized layer is indicated here as plating (1060). Next, the solder preform is tack welded to the substrate to obtain the frame lid (1070).

Many advantages accrue in the presently-described methods. In particular, shrinkage of the seal ring is eliminated. There is a reduction of outgassing during metallization, which prolongs the shelf life of the frame lid, and also improves seal integrity. Any type of solder can be attached to the seal ring. Solder optimization reduces PIND failures as well. The lead time is also improved.

The present disclosure has been described with reference to exemplary embodiments. Obviously, modifications and alterations will occur to others upon reading and understanding the preceding detailed description. It is intended that the present disclosure be construed as including all such modifications and alterations insofar as they come within the scope of the appended claims or the equivalents thereof.

The invention claimed is:

1. A method of making a frame lid assembly comprising:
providing a plate with a top surface, a bottom surface opposite the top surface and a sidewall that joins the top and bottom surface together, wherein the plate is made from a non-metallic material;
applying a mask to the top surface of the plate over a central area of the top surface of the plate to define a peripheral area on the top surface;
forming a seal ring by metallizing the peripheral area and the sidewall of the plate;
attaching a solder preform to the seal ring; and
removing the mask to obtain the frame lid, wherein the central area of the top surface of the plate is not metallized.

2. The method of claim 1, wherein the plate is made from glass or a ceramic selected from the group consisting of alumina ($Al_2O_3$), beryllia (BeO), aluminum nitride (AlN), zirconia toughened alumina (ZTA), SiC, and $Si_3N_4$.

3. The method of claim 1, wherein the seal ring is formed from a set of sublayers.

4. The method of claim 1, wherein the plate has a thickness of about 0.5 millimeter to about 1 millimeter.

5. The method of claim 1, wherein the plate is formed from a non-magnetic material.

6. The method of claim 1, wherein the peripheral area is from about 20% to about 35% of the surface area of the top surface of the plate.

7. The method of claim 1, wherein the seal ring is formed from a metal selected from the group consisting of silver, palladium, platinum, nickel, gold, titanium, tungsten-copper-nickel, palladium-gold-tin, and alloys thereof.

8. The method of claim 1, wherein the seal ring is formed from a non-magnetic metal.

9. The method of claim 1, wherein the seal ring on the peripheral area has a width of about 0.5 mm to about 1 mm.

10. The method of claim 1, wherein the seal ring on the peripheral area has a thickness of about 1 micrometer (μm) to about 40 μm.

11. The method of claim 1, wherein the plate is in the shape of a disk or a rectangular prism.

12. The method of claim 1, further comprising tack welding the solder preform to the seal ring.

13. The method of claim 1, wherein the solder preform has a melting temperature of from about 200° C. to about 350° C.

14. The method of claim 1, wherein the solder preform is formed from a gold-tin alloy, a lead-based alloy, or a lead-free alloy.

15. The method of claim 1, wherein the mask is made of a metal.

16. The method of claim 1, wherein the metallizing is performed by sputter deposition.

* * * * *